(12) United States Patent
Beyne et al.

(10) Patent No.: US 7,547,625 B2
(45) Date of Patent: Jun. 16, 2009

(54) METHODS FOR BONDING AND MICRO-ELECTRONIC DEVICES PRODUCED ACCORDING TO SUCH METHODS

(75) Inventors: Eric Beyne, Leuven (BE); Riet Labie, Kessel-Lo (BE)

(73) Assignee: Interuniversitair Microelektronica Centrum vzw (IMEC), Leuven (BE)

( * ) Notice: Subject to any disclaimer, the term of this patent is extended or adjusted under 35 U.S.C. 154(b) by 357 days.

(21) Appl. No.: 11/448,598

(22) Filed: Jun. 7, 2006

(65) Prior Publication Data

US 2006/0292824 A1 Dec. 28, 2006

Related U.S. Application Data

(60) Provisional application No. 60/688,994, filed on Jun. 8, 2005.

(51) Int. Cl.
*H01L 21/44* (2006.01)
(52) U.S. Cl. .................. 438/613; 438/615; 438/612; 438/614
(58) Field of Classification Search .......... 438/612–615
See application file for complete search history.

(56) References Cited

U.S. PATENT DOCUMENTS 4,818,728 A * 4/1989 Rai et al. ................... 438/108
5,196,371 A * 3/1993 Kulesza et al. ............. 438/119
5,844,315 A 12/1998 Melton et al.
6,168,972 B1 1/2001 Wang et al.
6,787,917 B2 9/2004 Lee et al.
6,821,878 B2 * 11/2004 Danvir et al. ............... 438/613
6,908,784 B1 6/2005 Farnworth et al.
7,242,097 B2 * 7/2007 Hua .......................... 257/767
2005/0266670 A1* 12/2005 Lin et al. .................... 438/613

FOREIGN PATENT DOCUMENTS

EP 0 875 935 A2 11/1998
WO WO 99/04430 1/1999

* cited by examiner

*Primary Examiner*—Luan C Thai
(74) *Attorney, Agent, or Firm*—Knobbe Martens Olson & Bear LLP

(57) ABSTRACT

One inventive aspect is related to a method of bonding two elements. The method comprises producing on a first element a first micropattern, comprising a first metal layer. The method further comprises producing on a second element a second micropattern, comprising a second metal layer. The method further comprises applying onto the first micropattern and/or on the second micropattern a layer of solder material. The method further comprises producing on at least one of the elements a patterned non-conductive adhesive layer around the micropattern on the element. The method further comprises joining the first micropattern and the second micropattern by means of a thermocompression or reflow method, wherein the producing of an adhesive layer is performed before the joining such that the first and second elements are secured to each other by the adhesive layer(s) after joining.

9 Claims, 5 Drawing Sheets

METHODS FOR BONDING AND MICRO-ELECTRONIC DEVICES PRODUCED ACCORDING TO SUCH METHODS

CROSS-REFERENCE TO RELATED APPLICATIONS

This application claims priority under 35 U.S.C. Section 119(e) to U.S. provisional patent application 60/688,994 filed on Jun. 8, 2005, which application is hereby incorporated by reference in its entirety.

BACKGROUND OF THE INVENTION

1. Field of the Invention

The present invention is related to the field of microelectronics. It relates to the fields of flip chip assembly, 3D-IC (3-dimensional Integrated Circuit) stacking, and MEMS (microelectromechanical system) packaging.

2. Description of the Related Technology

Standard high-density (typically a pitch smaller than 40 microns) chip-to-chip (also referred to as die-to-die), chip to wafer (also referred to as die to wafer) or wafer to wafer bonding assemblies are critical because of: the small diameter and narrow spacing of the solder patterns which:
  compromise solder joint reliability: high thermo-mechanical stress and plastic deformations during temperature cycling.
  generate the risk of solder-bridging between pads during reflow.
  cause a difficulty of applying a standard capillary underfill after assembly in the narrow gap.

A solution exists where no underfill is used but an almost fully metallized die-area with ring-shaped open areas around different electrical contact pads. The surrounding solder material hermetically seals these ring-shaped cavities. This method does however require large metal planes on both IC's, which may limit its general applicability.

SUMMARY OF CERTAIN INVENTIVE ASPECTS

Certain inventive aspects aim to provide a method for bonding 2 elements, as for instance chip-to-chip (also referred to as die-to-die), chip to wafer (also referred to as die to wafer, a wafer is also often called a substrate) or wafer to wafer bonding, which alleviates or avoids the problems of the prior art.

One inventive aspect is related to a method and devices such as described in the appended claims. One inventive aspect is similar to flip chip interconnect, but uses a low temperature melting metal or alloy and realizes an intermetallic connection.

Moreover, joined micropatterns may be used rather then solder balls: they have relatively small dimensions; they can be preferably thinner than 100 μm, more preferably thinner than 40 μm thick, or thinner then 20 μm, more preferably between 5 and 20 μm thick.

A connection is preferably made by a thermo/compression-reflow method. This is a method where both pressure and heat are applied. Pressure establishes a first mechanical bond and heat causes a diffusion process which results in a metallic bond. When applied simultaneously, the thermal diffusion process can be accelerated due to the pressure. The connection could also be made by heat alone or by pressure alone, in appropriate circumstances.

Hereby preferably the entire solder volume is transformed into an intermetallic compound.

Having a thin connection can be advantageous, since it allows for small thickness variation across the die and bonding substrates, which is reducing stress build-up and improves bonding-yield (can be smaller then solder thickness/2).

In advantageous embodiments, the use of a microsoldering method based on a Co/Sn system for the micropatterns can be used. This has an additional and superior performance over the currently used/proposed solder alloys:
  forms a stable (eg temperature stable) Sn-rich intermetallic phase; this can be for instance $CoSn_2$ or $CoSn$.
  forms a low modulus or higher ductility intermetallic phase (improved reliability). Its modulus is smaller then the moduli of for instance CuSn or AuSn; The E-modulus can be 2 to 5 times smaller than standard known and used IMC phases;
  it is believed that the Co/Co—Sn/Co system performs better under electromigration testing, i.e. it suffers less from electromigration then currently used solder alloys.
  it does not comprise less human health unfriendly materials than for instance Pb.

A known way to reduce interfacial stresses, caused by differences in stiffness between different parts of the solder joint, is the application of an underfill after bonding, but void-free underfill of micro-pattern connected elements with traditional capillary underfill methods is very difficult, as the gap between the different die becomes too small. Preferably this gap is typically smaller then 40 microns, or smaller then 20 microns, or smaller then 10 microns, or smaller then 5 microns, or smaller then 1 micron. Moreover some connections may break even before application of such underfill. This type of underfill is moreover applied typically after having singulated the dies, which brings some degree of complexity.

According to the embodiment of claim 1, a pre-defined photo-patterned non-conductive glue layer or adhesive layer is applied around the micropatterns described in the previously mentioned embodiments. The non-conductive glue layer or adhesive (polymer 'underfill') and conductive micropatterns can be applied in one single process flow. The electrical connections and adhesive joining can be performed in a common bonding process between two elements (eg. 2 substrates, 2 dies, or die and substrate, or other devices & substrates).

Some embodiments may become the micro-pattern solution of choice in the future. Some of the parameters which may be considered when comparing different solutions can be scalability, process complexity, yield, current carrying capability and overall reliability.

A method of bonding of two elements is disclosed comprising
  producing on a first element a first micropattern, comprising a first metal layer
  producing on a second element a second micropattern, comprising a second metal layer;
  applying onto the first micropattern and/or on the second micropattern a layer of solder material;
  joining the first micropattern and the second micropattern by means of a thermocompression or reflow method wherein the joined micropatterns form a permanent bond which comprise at least one intermetallic compound, the intermetallic compound(s) comprising the solder material and the first metal or/and comprising the solder material and the second metal.

In certain embodiments a further annealing step is performed after the joining step. This further annealing step can be needed to ensure that all the remaining solder material is consumed to form intermetallics. This is to prevent the presence of a thin solder layer that would be the weakest point of the micropattern.

The bonding strength of the permanent bond is preferably equal to or larger than the strength of a standard solder bump connection. Preferably it is higher then 6 kgf/mm². In advantageous embodiments the first metal is the same as the second metal.

The first micropattern and/or second micropattern comprise(s) further an upper layer which is a thin layer which can prevent oxidation of the first and second metal layers respectively, and/or which improves the wetting of the solder material to the first metal layer and/or second metal layer, and which dissolves or doesn't interfere in the interaction between the solder material and the first or second metal layer.

By one definition, a micropattern is a layered planar pattern with a thickness from a few 0.01 microns towards about 100 microns. It comprises at least one layer.

The micropatterns can have any shape, and can be microbumps, which have a localized nature. In certain embodiments, the microbumps have an essentially circular, rectangular or square shape with a diameter smaller then 10 microns, or 1 micron. The micropatterns can have any appropriate structure, as for instance a closed structure e.g. a ring or rectangular structure, or can cover larger areas on the elements. Such patterns, which are not bumps are further nominated as micropads. If only microbumps are used, a sufficient density of bumps may have to be chosen to achieve an optimal performance. In advantageous embodiments, the pitch of the microbumps is of the order of the (all equal) bump diameters.

In advantageous embodiments the pure first solder material is not present in the joined micropattern. Some solder material may still be present in a limited region peripheral to the joined micropatterns and not in the central part of the joined micropatterns. In certain embodiments the joined micropatterns consist essentially of one or more intermetallic compound(s). In certain embodiments only one intermetallic compound is formed. In certain embodiments the joined micropatterns form a ring or rectangle or any similar closed structure which can be used as a sidewall of a sealed or electromagnetically isolated cavity.

In advantageous embodiments, a step of providing, prior to bonding, a non conductive glue layer as for instance a polymer layer on the first element around the first micropattern or on the second element around the second micropattern can be present.

In other advantageous embodiments a step of providing a first non conductive glue layer on the first element around the first micropattern and a step of providing a second non conductive glue layer on the second element around the second micropattern, whereby the first and the second non-conductive glue layer have heights which are slightly less then the first and second micropatterns respectively, is applied before the joining step. Generally, the total height of the glue layer(s) is preferably about 1 to 5 micron smaller than the sum of the heights (before bonding) of the micropatterns, including the solder, so that during bonding, the micropatterns are making contact before the glue layer(s).

In preferred embodiments whereby a non conductive adhesive or glue layer is applied, advantageously a spacing or gap is left open between the micropatterns and the surrounding non conductive glue layers, the gap being at least 1 micron and preferably not larger then ⅓ of the joined pattern height. Larger gaps are not excluded but are expected to be less advantageous.

The first solder material B can be for instance Sn or In.

The first and the second lower materials A and C can comprise or consist of copper, cobalt, nickel, or any alloy of these materials. The second upper material (D) can be preferably Au or Sn, but other materials are not excluded.

The non conductive adhesive or glue can be for instance a polymer (for instance benzo cyclobutene (BCB) or silicone).

The non conductive adhesive can be applied by spinning, spin-coating, spray-coating, curtain-coating, dry-film as for instance lamination. They can be patterned by techniques known to a person of ordinary skill.

Also a composite electronic device is disclosed, resulting from one of the inventive methods, comprising:
 a first element;
 a second element, the second element bonded to the first element, by joined micropatterns.

wherein the joined micropatterns form a permanent bond which comprises an intermetallic compound, the intermetallic compound comprising a solder material.

In preferred embodiments a pure solder material is not present in the joined micropattern. This can be achieved if one knows the intermetallic(s) that is (are) expected to be formed, by providing less solder material then 'reagens material'. Some solder material may still be present in a limited region peripheral to the joined micropatterns and thus not in the central part of the joined micropatterns. The central part can be seen as the part of the micropattern which is necessary to guarantee (typically in a certain configuration or context) a proper local bond or global bond of the two elements. In certain embodiments the joined micropatterns consist essentially of one or more intermetallic compound(s). In certain embodiments only one intermetallic compound is present in the micropattern.

The joined micropatterns can form a ring or rectangle or any similar closed structure, which can be used as a sidewall of a sealed or electromagnetically isolated cavity.

In advantageous embodiments, the joined micropatterns are surrounded by a non conductive adhesive, which is also bonding the first element and the second element, and wherein a spacing or gap is present between the micropatterns and the surrounding non- conductive glue layers, the gap being at least 1 micron and preferably not larger then ⅓ of the joined pattern height. The first solder material can be Sn or In, but can be any appropriate solder material known to a person skilled in the art.

The joined micropatterns advantageously comprise copper or cobalt, nickel and or any of their alloys. In advantageous embodiments the intermetallic compound can be CoSn or CoSn2. The non conductive adhesive can be a polymer (as for instance BCB) or silicone.

DETAILED DESCRIPTION OF CERTAIN ILLUSTRATIVE EMBODIMENTS

Certain embodiments are related to a technique wherein a first and second element are provided, these elements preferably being substrates such as dies, chips or wafers. On both substrates, a metallized micro-pattern is produced. This may be a pattern of metal lines or a series of metal bumps or pads or a combination of lines, bumps and/or pads. The same pattern is produced on both substrates, so as to bond the substrates together by bringing both micropatterns in contact. A preferred method for realizing the micro-patterns is semi-additive electroplating. Other methods known to a person of ordinary skill are also possible and include lift-off evaporation techniques.

Figure 1:
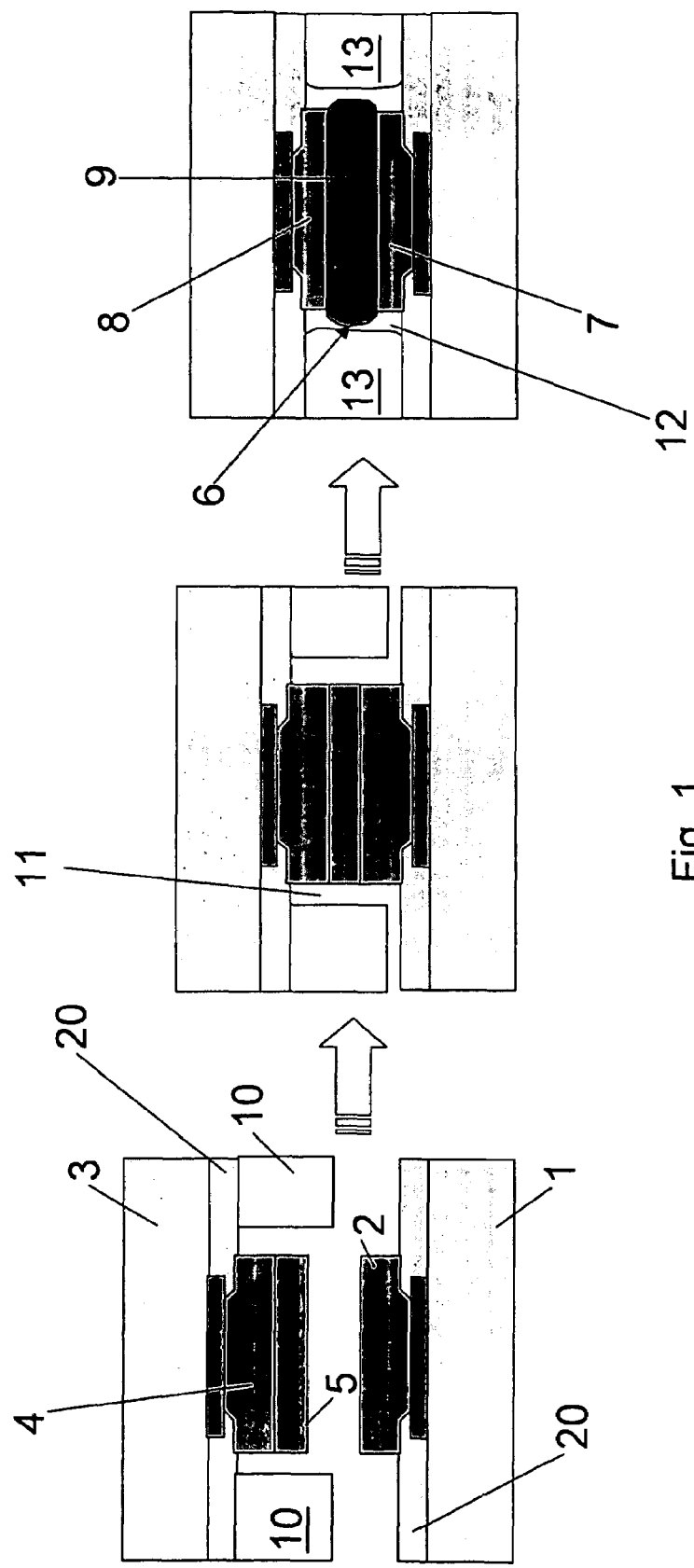
FIG. 1 illustrates an embodiment with solder and glue on the top element; alternatively the solder material can be applied on only the lower element, or on top and bottom elements.

According to some embodiments, the micropatterns consist of or comprise a metal with a high melting point (hereafter called 'high-melting metal'), such as Co or Cu. FIG. 1 shows an embodiment wherein a first substrate 1 is provided with a first micropattern 2, comprising a first high-melting metal A and a second substrate 3 is provided with a second micropattern 4, comprising a second high-melting metal C. On the second micropattern, a layer 5 of solder material B is applied, eg. a layer of Sn. The bonding will take place by bringing both substrates in contact and by applying a pressure and/or an increase in temperature, or by a reflow step, bonding takes place. The result is a bonding structure 6 which comprises a first portion 7, in contact with the first substrate 1, the first portion corresponding to the first micropattern 2 and comprising the first high-melting metal A, a second portion 8, in contact with the second substrate 3, the second portion corresponding to the second micropattern 4 and comprising the second high-melting metal, and a middle portion 9, comprising solder material and/or one or more intermetallic compounds of the solder material and one or both of the high-melting metals. A solder layer may be applied on one of the micropatterns (asymmetric embodiment, FIGS. 1 and 2), or on both of the micropatterns (symmetric embodiment, FIG. 3). In the embodiment of FIG. 1, a thin layer of a metal D (not shown) may be applied on the micropattern of the first substrate 1, i.e. on the micropattern 2 on which no solder layer is applied. The metal layer D has the function of preventing oxidation of the underlying metal of the micropattern 2, and may also facilitate wetting by the solder layer 4. This material is preferably identical to the material B and will hereafter also be called 'solder' material. Layer D is preferably a thin layer that easily dissolves in the high-melting metal A and does not reduce the reaction between the metals B and C. Preferred material combinations are a thin Au layer (D) on a Cu pad (C) for Cu—Sn micropatterns or a thin Sn layer (D) on a Co pad (C) for Co—Sn micropatterns.

Figure 2:
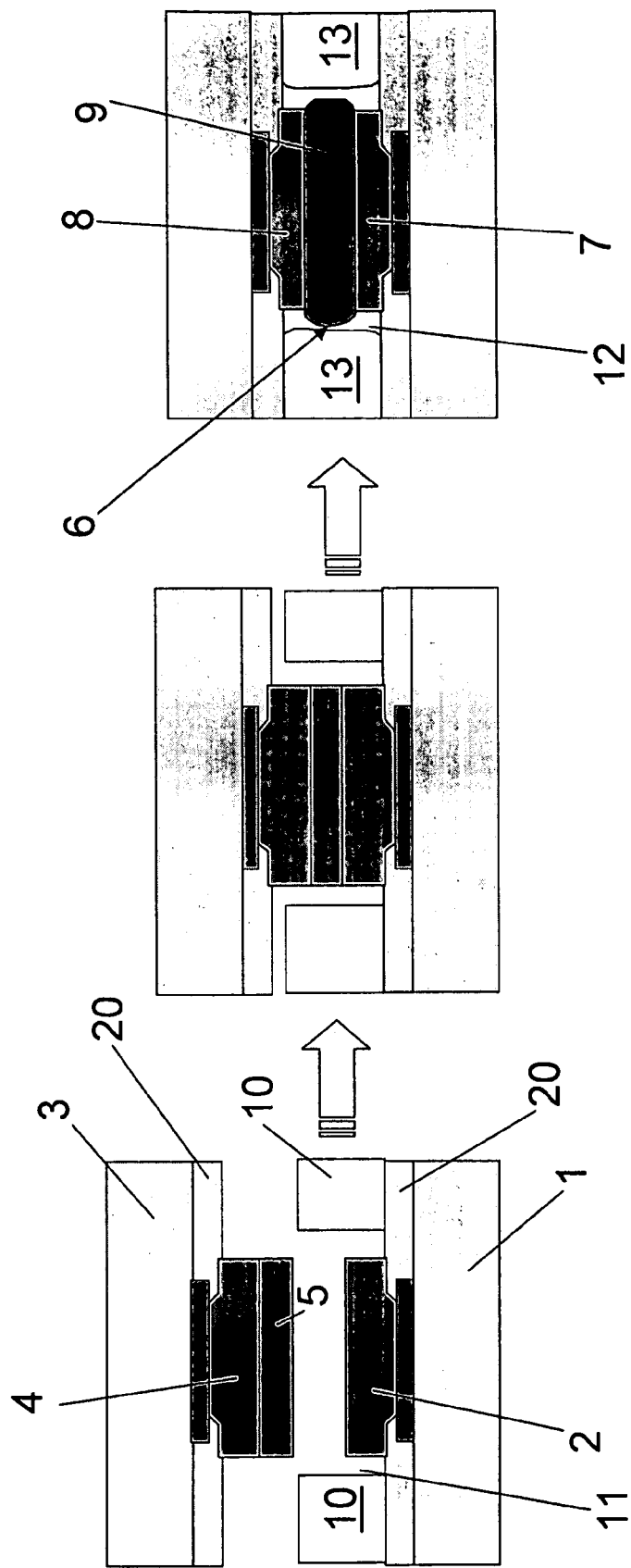
FIG. 2 illustrates an embodiment with solder on the top element, and glue on the bottom element. The solder can be on the bottom element only or on both elements.
Figure 3:
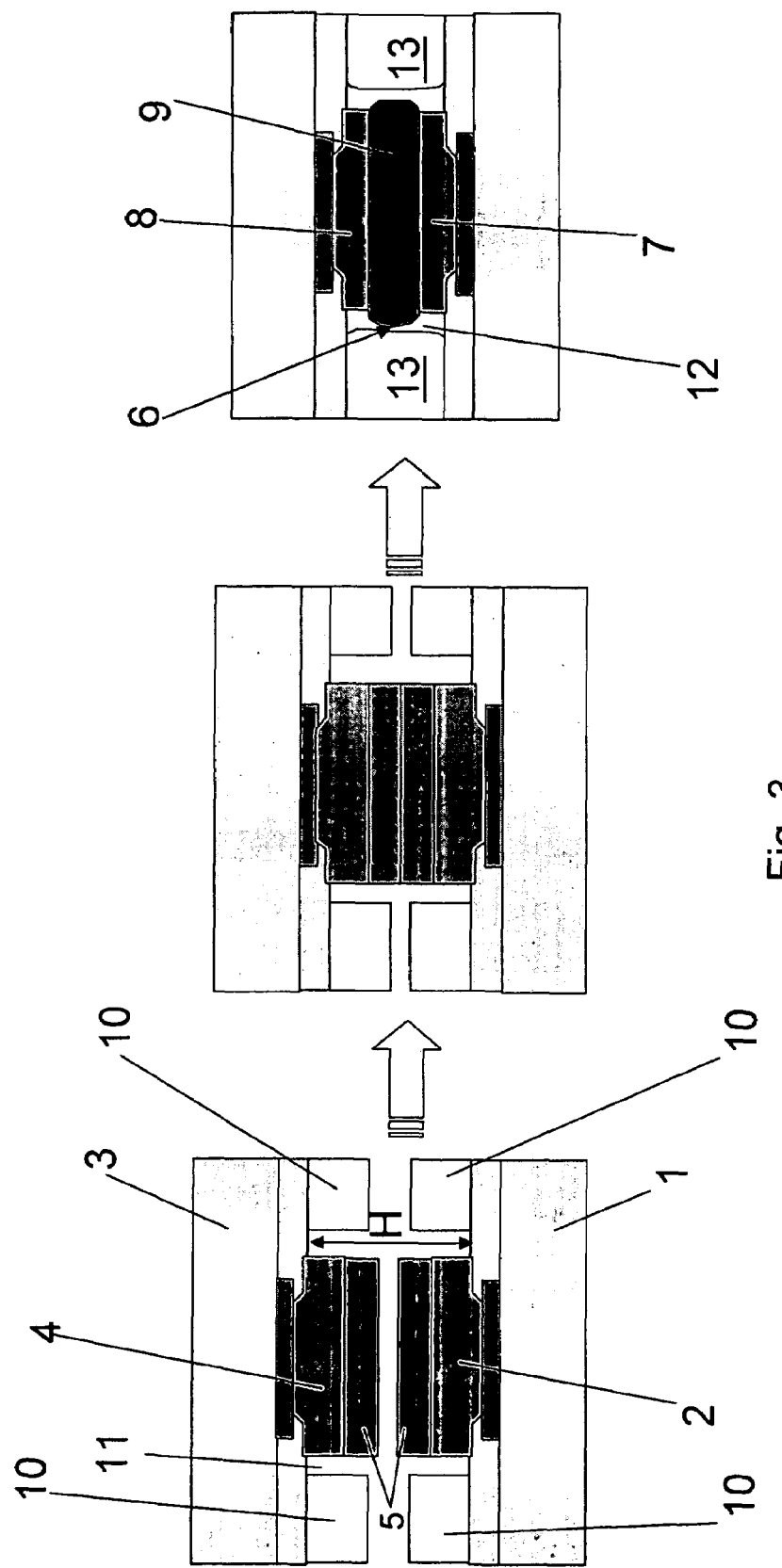
FIG. 3 illustrates some embodiments with matching patterns of solder and glue on both elements. The solder can be on the top element only, on the bottom element only or on both elements.

According to some embodiments shown in FIGS. 1 to 3, a patterned layer or film 10 of a non-conductive adhesive material, e.g. a uniform polymer layer is applied around (i.e. on both lateral sides of) at least one of the micropatterns which are to be joined. In the preferred embodiment, the adhesive layer extends on the whole surface of the substrate, outside of the micropatterns.

The thickness of the adhesive layer(s) is such that during bonding, i.e. as the elements are brought closer together, the micropatterns make contact before the adhesive layer(s). In the case of FIGS. 1 and 2, this means that the thickness of the single glue layer 10 is slightly lower than the combined thickness (before bonding) of the upper micropattern 4, the solder layer 5 and the lower micropattern 2. In the case of FIG. 3, the combined thickness of the glue layers 10 is slightly lower than the combined thickness (before bonding), of the micropatterns 2 and 4, and the two solder layers 5. The difference in thickness between the glue layer(s) and the combined micropattern/solder layer is preferably 1 to 5 micron. In other words, during bonding, when the micropatterns/solder layer fist come in contact, the distance between the glue layer (FIG. 3) or between the single glue layer and the opposite substrate is in the order of 1-5 micron. Only by approaching the elements further towards each other, the glue layer(s) make contact (see further).

The adhesive layer is typically applied by spin-coating or spray-coating or lamination, but can be applied by other techniques known to a person of ordinary skill.

The patterning of the uniform polymeric layer is preferably performed by photo patterning and wet development, but can be applied by other techniques known to a person of ordinary skill. The patterning step removes the polymer from the surface of the micro-patterns and leaves a small gap 11 between the micro-patterns and the remaining polymer layer. The width of the gap 11 is at least 1 micron and preferably not larger then ⅓ of the joined pattern height H, as shown in FIG. 3. Larger gaps are not excluded but are expected to be less advantageous. In one embodiment, due to the initial gap 11, a gap 12 is present between the joining structure 6 and the cured adhesive layer 13. The adhesive layer secures the elements together, and fulfills the same role as the known underfill material, applied after bonding according to prior art methods. The advantage of certain embodiments is that the adhesive layer is applied prior to bonding, so the problem of applying a standard capillary underfill after assembly in the narrow gap, is no longer relevant.

The film 10 is then dried and the polymer in the film preferably remains in an incomplete curing-state to allow for reacting with the adhesive material of the other substrate (if such material is applied on both substrates) during the final curing applications. The glue material preferably doesn't produce any outgassing during the final curing step, as this may cause voiding and incomplete bonding. Typical materials that can be used for this application are photo-sensitive BCB (Cyclotene) from Dow Chemical and photo-sensitive silicones from Dow Corning, but other materials can be used which are known to a person of ordinary skill.

The bonding is preferably performed in two steps. In a first step, the substrates are aligned with respect to each other and pre-bonded to each other. Pre-bonding can be performed at low temperature with lower forces. The temperature is preferably well below the curing temperature of the adhesive layer and well below the melting temperature of the solder material. The intention is that the solder material B of the top substrate 3 adheres sufficiently well to the solder metal B or to the non-oxidizing layer of the lower substrate 1, or to the micropattern 2 itself, if no solder nor a non-oxidizing layer is present. At this point, little interaction between the contacted metals occurs, but a weak bond is formed, sufficiently strong to maintain the alignment and contact between the two substrates during the subsequent handling. Also, no curing of the polymeric material takes place at this stage.

In a second step, the wafer formed by the pre-bonded substrates is preferably placed in a non-oxidizing ambient (for instance vacuum, nitrogen, forming-gas). The wafer is pre-heated to a temperature below the melting point of the solder (metal B) and below the curing temperature of the polymer. In a next step, the temperature is rapidly ramped up to a temperature whereby bonding occurs and if needed a uniform pressure is applied to the top substrate 3. This temperature is typically above the melting point of the solder, but can be performed below the melting point of the solder as well when an appropriate pressure is used. At that moment, the solder metal B will interact with the corresponding solder metal B or cap metal D, or metal of the opposite micropattern. The liquid solder pattern will deform (collapse) as a result of the applied pressure at wafer level. At that moment, the still un-cured polymer layer will make contact with the surface of the opposite substrate (a second polymer layer in the symmetric embodiments, the substrate passivation layer 20 in the asymmetric embodiments). Due to the high temperature, the polymer layer will deform and start curing. By further increasing the temperature, the curing reaction of the polymer may be accelerated to achieve a fully cured permanent adhesive layer that secures the bonding of the substrates after releasing the pressure between both substrates. In the symmetric embodiments, the solder metals B form one common melt that interacts with both metals A and C. In the asymmetric embodiments, the solder metal B dissolves metal D and reacts with metal C. The different metals may dissolve and form alloys and/or generate intermetallic compounds.

For BCB-to-BCB bonding (very low) forces are used (from about 250 to about 400 gf) for areas of a few square mm. After cooling down and removing the pressure, the substrates are permanently bonded. Depending on the solder volume used, a solder layer or different alloys and intermetallic phases may be present in the intermetallic micro-pattern joints.

A further annealing step may be used to fully transform the micropattern solder layers into a single intermetallic compound.

To obtain this result, the volume of solder metal B and D is of the same order or smaller than the metals A and C. As a result, during the soldering operation, the entire solder volume will be transformed into alloy or intermetallic compounds. During this process, the liquidus temperature of the melt will increase and a solidification of the melt may occur. The previous description is in fact a simplified illustration; it should be noted that the volume of solder material B and D will react with the metals A and C according to a certain ratio linked with the structure of the resulting intermetallic. For Co and thin Sn forming CoSn this ratio would be approximately 1:1. For Co and Sn forming CoSn2 this ratio would be 1:2, which means that twice as much solder will be consumed than metal when forming the intermetallic alloy.

According to the preferred embodiment, the micropatterns 2 and 4 are made of Co, and the solder is Sn. The specific combination of Co and Sn in the production and bonding of micropatterns as defined in the context of some embodiments is unknown in the art. Compared to other material combination (Cu and Sn for example), it has been found that the formation of the intermetallics during bonding takes place much faster when using Co and Sn, which provides a considerable advantage over the known combinations. For a similar amount of Sn and an equal reflow temperature of 250 C, the full transition of Sn into Co—Sn intermetallic is more then 5 times faster compared to the transition into Cu—Sn intermetallics. According to the preferred embodiment, a volume of Sn is applied such that the result is a bonding structure which comprises essentially only intermetallic compounds of Co and Sn, in particular CoSn or CoSn2, and no pure solder material.

To this aim, in order to obtain a joined structure comprising in the region 9 only CoSn2, the thickness of the layers can be based on the following model and calculation:

Starting from a solder layer (Sn) with thickness 'x' (possibly the sum of the two solder layers), the 'consumed' metal layer thickness d of the Co layers, in order to arrive at a joined structure with no pure Sn, is calculated as:

$$d = \frac{wt\%_{Co}}{wt\%_{Sn}} \cdot \frac{\rho_{Co}}{\rho_{Sn}} \cdot x$$

With $\rho$ the density of the materials in question and:

$$wt\%_{Co} = \frac{at\%_{Co} \cdot m_{UCo}}{at\%_{Co} \cdot m_{Co} + at\%_{Sn} \cdot m_{Sn}}$$

$$wt\%_{Sn} = \frac{at\%_{Sn} \cdot m_{Sn}}{at\%_{Co} \cdot m_{Co} + at\%_{Sn} \cdot m_{Sn}}$$

wherein at % is derived from the stoechiometric composition of the final intermetallic, and m is the atomic mass.

In the case of CoSn2, at $\%_{Co}$ is approximately 0.33 and at $\%_{Sn}$ is approximately 0.67. In the case of CoSn, at $\%_{Co}$ and at $\%_{Sn}$ are approximately 0.5.

The thickness of the micropatterns 2 and 4 can be chosen such that the thickness d is available for the reaction to form the intermetallic. This means that the sum of the thicknesses of the cobalt micropatterns 2 and 4 must be at least equal to d. Preferably, the sum of these thicknesses is higher than d, so that enough metal is left to form the portions 7 and 8 (FIG. 1). As an example, each metal layer 2 and 4 is provided at a thickness of approximately d, so that after bonding, the remaining metal layers are of thickness d/2.

Generally, the intermetallic compounds of Co and Sn (CoSn and CoSn2) have other advantages over more traditional metal combinations, such as Cu/Sn:

high Sn-content: low consumption of the Co layer (less thickness required of the UBM metal A and C), it is possible to form of a single intermetallic compound with specific composition (see above), Low modulus of the intermetallic compound results in lower stress induced by the micropatterns on the devices and less peeling stress on the adhesive layers (when present).

Higher resistance to electromigration of the CoSn.

The Co/Sn may be used with and without the polymer adhesive layer 10. If no adhesive layer is used, a larger area of the die is preferably covered by micro-patterns to ensure mechanical stiffness. Of particular interest is the use of a micro-pattern solder ring on the perimeter of the device. This ring may be used to create a quasi-hermetically sealed cavity with micro-pattern connections. This technique is of particular interest for the bonding (capping) of MEMS devices.

Figure 4:
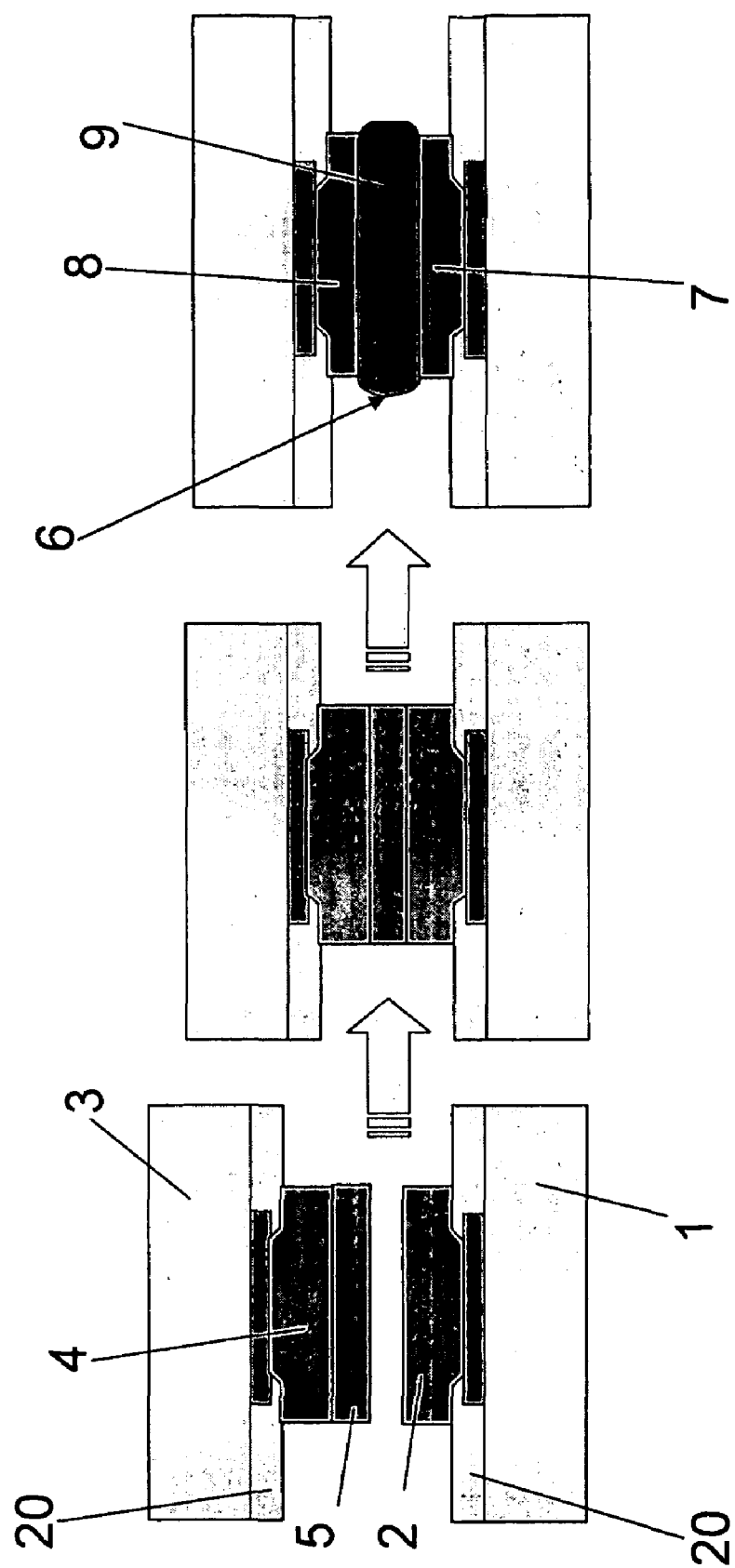
FIGS. 4 and 5 illustrate some embodiments wherein no glue layer is applied.
Figure 5:
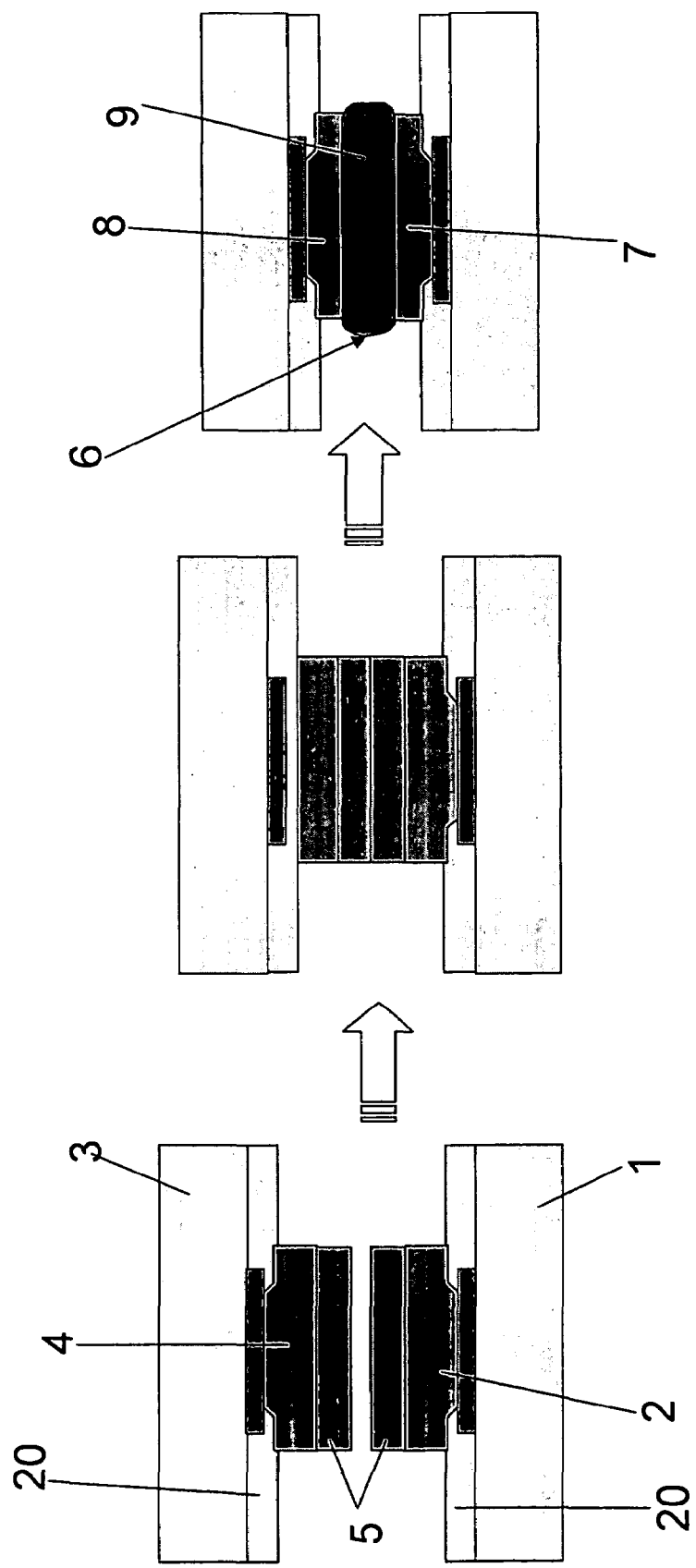

The embodiments wherein Co/Sn are applied without the adhesive layers, are illustrated in FIGS. 4 and 5.

Some embodiments are equally described in the following.

Micro-patterns may be realized using the technique shown in FIG. 1. In this case, a very small solder volume-pattern is used. The die 1 is bonded to a complementary patterned die or wafer 2. When the sample is heated above the solder melting temperature, it will melt and alloy with the metallisations of the other device. A typical example is bonding of a Cu/Sn pattern on a Cu pad. This process may also be achieved without melting the solder layer. Solid-state diffusion may also create this structure. Actually, after bonding, the sample may be annealed to transform the entire solder volume in intermetallic compounds, leaving no unreacted solder, and thereby raising the melting temperature of the assembly.

Device Substrate Preparation

First a micro-solder pattern is realized on the electrical contact pads of the devices. This micro-solder pattern can comprise and typically consists of two or more metal layers. The two top metal layers can consist of or comprise a high melting point metal A, such as Cu or and a low melting point metal B, such as Sn ('solder'). These metals should form intermetallic compounds or alloys when the temperature of the device approaches (solid state diffusion) or increases above the melting point (soldering) of the low melting temperature metal B. A preferred method for realizing the micro-patterns is semi-additive electroplating. Other methods known to a person of ordinary skill are also possible and include lift-off evaporation techniques.

In a certain embodiment (called symmetric embodiment, see FIG. 2), solder layers are prepared equally on both devices. In another embodiment (called asymmetric embodiment, see FIG. 1), the solder is applied only on the first device. On the second device, solderable contact metallization C are foreseen. This can preferably be the same material as the material A used as high melting point metal in the micro-pattern. This layer may be covered by a thin metal layer D that prevents oxidation of the bottom metal layer or improves the wetting of the low melting temperature metal B of the micro-pattern to the contact pad. This material is preferably identical to the material B or should be a thin layer that easily dissolves in the high temperature melting material A and does not reduce the reaction between the materials B and C. Preferred material combinations are a thin Au layer (D) on a Cu pad (C) for Cu—Sn micropatterns or a thin Sn layer (D) on a Co pad (C) for Co—Sn micropatterns.

After realizing the micro-solder patterns, a uniform polymeric layer can be deposited on the device and patterned. In the symmetric embodiments, this layer should have a thickness, slightly lower than the micro-solder pattern thickness, which is measured from the device substrate to the average top surface of the micro-patterns. This height thickness is typically 1-5 µm lower. In the asymmetric embodiments, this layer should have a thickness slightly lower than the combined thickness of the micro-pattern on the first device and contact pad metallization on the second device. This layer is typically applied by spin-coating or spray-coating or lamination, but can be applied by other techniques known to a person of ordinary skill, some of which have been mentioned before.

The patterning of the uniform polymeric layer is preferably performed by photo patterning and wet development, but can be applied by other techniques known to a person of ordinary skill. The patterning step removes the polymer from the surface of the micro-patterns and leaves a small gap between the micro-patterns and the remaining polymer layer. The film is dried and the polymer in the film preferably remains in an incomplete curing-state to allow for reacting with the material of the second device during the final curing applications. The material preferably doesn't produce any outgassing during the final curing step, as this may cause voiding and incomplete bonding. Typical materials that can be used for this application are photo-sensitive BCB (Cyclotene) from Dow Chemical and photo-sensitive silicones from Dow Corning, but other materials can be used which are known to a person of ordinary skill.

Device Bonding

The bonding is preferably performed in two steps. In a first step, the devices are aligned with respect to each other and pre-bonded to each other. Pre-bonding can be performed at low temperature with lower forces. The temperature is preferably well below the curing temperature of the polymeric adhesive layer and well below the melting temperature of the solder material. The intention is that the low melting point metal B of the top device adheres sufficiently well to the metal B or metal D of the lower device (method 1 or 2, respectively). At this point little interaction between the contacted metals occurs, but a weak bond is formed, sufficiently strong to maintain the alignment and contact between the two devices during the subsequent handling. Also, no curing of the polymeric material is preferred.

This method allows for the placement of a large number of devices on a large base substrate (e.g. multi-die-to wafer bonding). The die-to-wafer process is a sequential process. Therefore, the time needed for the placement and pre-bonding should be minimized as much as possible. Therefore, the actual bonding is performed in a second, collective, processing step.

During collective bonding, the wafer is preferably placed in a non-oxidizing ambient (for instance vacuum, nitrogen, forming-gas). The wafer is pre-heated to a temperature below the melting point of the solder (metal B) and below the curing temperature of the polymer. In a next step, a Uniform pressure is applied over all die bonded to the base wafer and the temperature is rapidly ramped up to a temperature whereby bonding occurs. This is typically above the liquidus temperature of the solder, but can be performed below the melting point of the solder as well. At that moment, the solder metal B will interact with the corresponding solder metal C (method 1) or cap metal D (method 2). The liquid micro-solder solder pattern will deform (collapse) as a result of the applied pressure at wafer level. At that moment, the still un-cured polymer layer will make contact with the surface of the base substrate (a polymer layer in the symmetric embodiments, the substrate passivation layer in the asymmetric embodiments). Due to the high temperature, the polymer layer will deform and start curing. By further increasing the temperature, the curing reaction of the polymer may be accelerated to achieve a fully cured permanent glue layer that secures the die-wafer bonding after releasing the pressure between both wafers. In the symmetric embodiments, the solder metals B and D form one common melt that interacts with both metals A and C. In the asymmetric embodiments, the solder metal B dissolves metal D and reacts with metal C. The different metals may dissolve and form alloys and/or generate intermetallic compounds. In contrast to standard flip-chip assembly techniques, the volume of solder metal B and D is of the same order or smaller than the metals A and C. As a result, during the soldering operation, the entire solder volume will be transformed into alloy or intermetallic compounds. During this process, the liquidus temperature of the melt will increase and a solidification of the melt may occur. The previous description is in fact a simplified illustration; it should be noted that the volume of solder material B and D will react with the metals A and C according to a certain ratio linked with the structure of the resulting intermetallic. For Co and thin Sn forming CoSn this ratio would be approximately 1:1. For Co and Sn forming CoSn2 this ratio would be 1:2, which means that twice as much solder will be consumed than metal when forming the intermetallic alloy.

After cooling down and removing the pressure, the devices are permanently bonded. Depending on the solder volume used, a solder layer or different alloys and intermetallic phases may be present in the intermetallic micro-pattern joints. A further annealing step may be used to fully transform the micropattern solder layers into a single intermetallic compound.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of bonding two elements comprising:
producing on a first element a first micropattern, comprising a first metal layer;
producing on a second element a second micropattern, comprising a second metal layer;
applying on the first micropattern and/or on the second micropattern a layer of solder material;
producing on at least one of the elements a patterned non-conductive adhesive layer around the micropattern on the element;
joining the first micropattern and the second micropattern by a thermocompression or reflow process;
wherein the producing of an adhesive layer is performed before the joining such that the first and second elements are secured to each other by the adhesive layer after joining,
wherein the first and second micropatterns are formed from cobalt (Co), and wherein the solder layer comprises a tin (Sn) layer, wherein the sum of the thicknesses of the first and second micropatterns is at least equal to a value d, determined as $$d = \frac{wt\%_{Co}}{wt\%_{Sn}} \cdot \frac{\rho_{Co}}{\rho_{Sn}} \cdot x$$

wherein x represents the thickness of the solder layer or sum of the thicknesses of the solder layers, ρ represents the density of the material and:

$$wt\%_{Co} = \frac{at\%_{Co} \cdot m_{UCo}}{at\%_{Co} \cdot m_{Co} + at\%_{Sn} \cdot m_{Sn}}$$

$$wt\%_{Sn} = \frac{at\%_{Sn} \cdot m_{Sn}}{at\%_{Co} \cdot m_{Co} + at\%_{Sn} \cdot m_{Sn}}$$

and wherein at% is derived from the stoechiometric composition of the final intermetallic compound, and m is the atomic mass.

2. The method according to claim 1, wherein the adhesive layer is patterned to leave a gap between the adhesive layer and the micropattern around which said the adhesive layer is applied.

3. The method according to claim 2, wherein the width of the gap is at least about 1 μm, and not larger than about ⅓ of the joined pattern height.

4. The method according to claim 1, wherein the adhesive layer comprises a polymer layer, or a layer of a photo-sensitive BCB (Benzo-cyclo butene) or a photo-sensitive silicone.

5. The method according to claim 1, wherein the combined thickness of the one or more adhesive layer is smaller than the combined thickness of the first micropattern, the second micro pattern, and the one or more solder layers.

6. The method according to claim 1, wherein the combined thickness of the one or more adhesive layer is about 1 to 5 micron smaller than the combined thickness of the first micropattern, the second micro pattern, and the one or more solder layers.

7. The method according to claim 1, wherein the joining further comprises:
pre-bonding the first and second micropatterns at a first temperature; and
bonding the first and second micropatterns at a second temperature substantially higher than the first temperature.

8. A method of bonding two elements comprising:
producing on a first element a first micropattern, comprising a first metal layer;
producing on a second element a second micropattern, comprising a second metal layer;
applying onto the first micropattern and/or on the second micropattern a layer of solder material;
joining the first micropattern and the second micropattern by a thermocompression or reflow process,
wherein the first and second micropatterns are formed from cobalt (Co), and wherein the solder layer comprises a tin (Sn) layer,
wherein the sum of the thicknesses of the first and second micropatterns is at least equal to a value d, determined as:

$$d = \frac{wt\%_{Co}}{wt\%_{Sn}} \cdot \frac{\rho_{Co}}{\rho_{Sn}} \cdot x$$

wherein x represents the thickness of the solder layer or sum of the thicknesses of the solderlayers, ρ represents the density of the material and:

$$wt\%_{Co} = \frac{at\%_{Co} \cdot m_{UCo}}{at\%_{Co} \cdot m_{Co} + at\%_{Sn} \cdot m_{Sn}}$$

$$wt\%_{Sn} = \frac{at\%_{Sn} \cdot m_{Sn}}{at\%_{Co} \cdot m_{Co} + at\%_{Sn} \cdot m_{Sn}}$$

wherein at% is derived from the stoechiometric composition of the final intermetallic compound, and m is the atomic mass.

9. The method according to claim 8, wherein the joining further comprises:
pre-bonding the first and second micropatterns at a first temperature; and
bonding the first and second micropatterns at a second temperature substantially higher than the first temperature.

* * * * *